(12) United States Patent
Zabroda (10) Patent No.: US 10,734,090 B2
(45) Date of Patent: Aug. 4, 2020

(54) METHOD AND SYSTEM FOR A TRACK AND HOLD AMPLIFIER WITH EXTENDED DYNAMIC RANGE

(71) Applicant: Luxtera, Inc., Carlsbad, CA (US)

(72) Inventor: Oleksiy Zabroda, Constable, NY (US)

(73) Assignee: Luxtera LLC., Wilmington, DE (US)

( * ) Notice: Subject to any disclaimer, the term of this patent is extended or adjusted under 35 U.S.C. 154(b) by 0 days.

(21) Appl. No.: 16/458,084

(22) Filed: Jun. 30, 2019

(65) Prior Publication Data

US 2020/0005882 A1     Jan. 2, 2020

Related U.S. Application Data

(60) Provisional application No. 62/692,290, filed on Jun. 29, 2018.

(51) Int. Cl.
*G11C 27/02* (2006.01)
*H03F 3/16* (2006.01)
*H03F 3/00* (2006.01)

(52) U.S. Cl.
CPC ........... *G11C 27/026* (2013.01); *H03F 3/005* (2013.01); *H03F 3/16* (2013.01); *H03F 2200/297* (2013.01)

(58) Field of Classification Search
CPC ...... G11C 27/02; G11C 27/024; G11C 27/026
See application file for complete search history.

(56) References Cited

U.S. PATENT DOCUMENTS 8,610,467 B2 * 12/2013 Kabir ................. G11C 27/02
                                                                327/94
8,704,691 B2 * 4/2014 Zabroda ............... G11C 27/026
                                                                341/122

* cited by examiner

*Primary Examiner* — Hai L Nguyen
(74) *Attorney, Agent, or Firm* — Patterson + Sheridan, LLP (57) ABSTRACT

Systems and methods for a track and hold amplifier with extended dynamic range may include a track amplifier comprising a first PMOS transistor coupled to a first NMOS transistor, a second PMOS transistor coupled to a second NMOS transistor, a capacitor at gates of each NMOS and PMOS transistor, and a plurality of switches. The track and hold amplifier is operable to, during a tracking mode of the track and hold amplifier, couple a differential input signal to each NMOS and PMOS transistor via a first switch coupled to a first capacitor coupled to the gate of the first PMOS transistor and a second capacitor coupled to the gate of the first NMOS transistor, and via a second switch coupled to a third capacitor coupled to the gate of the second PMOS and a fourth capacitor coupled to the gate of the second NMOS transistor.

22 Claims, 7 Drawing Sheets

METHOD AND SYSTEM FOR A TRACK AND HOLD AMPLIFIER WITH EXTENDED DYNAMIC RANGE

CROSS-REFERENCE TO RELATED APPLICATIONS/INCORPORATION BY REFERENCE

This application claims priority to and the benefit of U.S. Provisional Application No. 62/692,290 filed on Jun. 29, 2018, which is hereby incorporated herein by reference in its entirety.

FIELD

Certain embodiments of the disclosure relate to electronic signal processing. More specifically, certain embodiments of the disclosure relate to a method and system for a track and hold amplifier with extended dynamic range.

BACKGROUND

Conventional approaches for performing sampling signals may be costly, cumbersome, and/or inefficient—e.g., they may be complex and/or time consuming, require considerable power, and/or may introduce errors or distortion.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for a track and hold amplifier with extended dynamic range, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1:
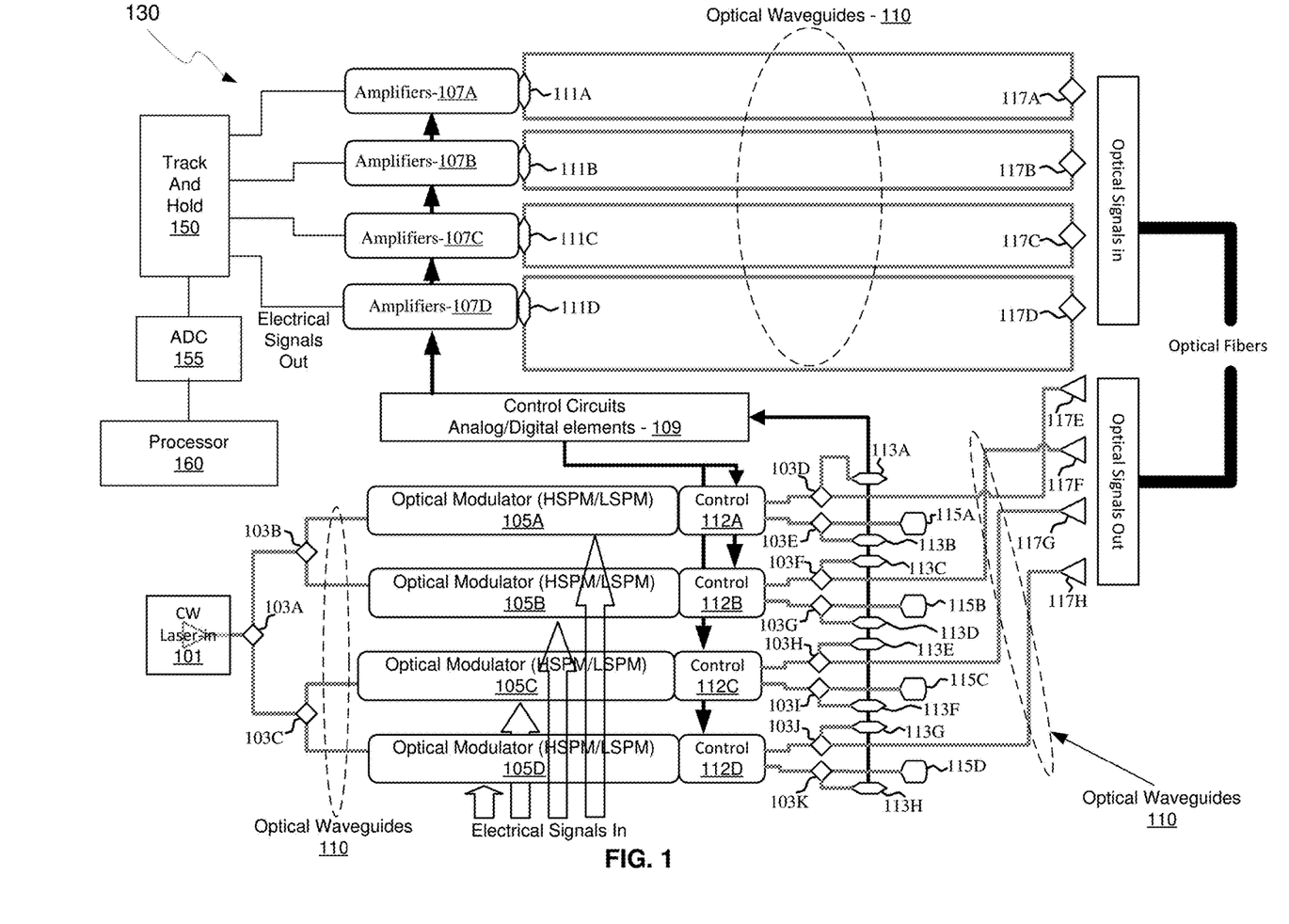
FIG. 1 is a block diagram of a photonically-enabled integrated circuit with a track and hold amplifier with extended dynamic range, in accordance with an example embodiment of the disclosure.

FIG. 1 is a block diagram of a photonically-enabled integrated circuit with a track and hold amplifier with extended dynamic range, in accordance with an example embodiment of the disclosure. Referring to FIG. 1, there are shown optoelectronic devices in a photonically-enabled integrated circuit 130 comprising optical modulators 105A-105D, photodiodes 111A-111D, monitor photodiodes 113A-113D, and optical devices comprising couplers 103A-103C and grating couplers 117A-117H. There are also shown electrical devices and circuits comprising amplifiers 107A-107D, analog and digital control circuits 109, control sections 112A-112D, track and hold amplifiers 150, analog to digital converters (ADCs) 155, and a processor 160. The amplifiers 107A-107D may comprise transimpedance and limiting amplifiers (TIA/LAs), for example.

In an example scenario, the photonically-enabled integrated circuit 130 comprises one or more CMOS photonics die with a laser assembly 101 coupled to the top surface of one of the die. The laser assembly 101 may comprise one or more semiconductor lasers with isolators, lenses, and/or rotators for directing one or more continuous-wave (CW) optical signals to the coupler 103A. The photonically enabled integrated circuit 130 may comprise a single chip, or may be integrated on a plurality of die, such as with one or more electronics die and one or more photonics die.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical power splitter, may comprise at least one input waveguide and at least two output waveguides. The couplers 103A-103C shown in FIG. 1 illustrate 1-by-2 splitters, which divide the optical power in one waveguide into two other waveguides evenly. These Y-junction splitters may be used in multiple locations in an optoelectronic system, such as in a Mach-Zehnder interferometer (MZI) modulator, e.g., the optical modulators 105A-105D, where a splitter and a combiner are needed, since a power combiner can be a splitter used in reverse.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

One output of each of the optical modulators 105A-105D may be optically coupled via the waveguides 110 to the grating couplers 117E-117H. The other outputs of the optical modulators 105A-105D may be optically coupled to monitor photodiodes 113A-113D to provide a feedback path. The IC 130 may utilize waveguide based optical modulation and receiving functions. Accordingly, the receiver may employ an integrated waveguide photo-detector (PD), which may be implemented with epitaxial germanium/SiGe films deposited directly on silicon, for example.

The grating couplers 117A-117H may comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

Optical fibers may be epoxied, for example, to one or more of the CMOS chips, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

In another exemplary embodiment, optical signals may be communicated directly into the surface of one or more of the photonically-enabled die without optical fibers by directing a light source on an optical coupling device in the chip, such as the light source interface 135 and/or the optical fiber interface 139. This may be accomplished with directed laser sources and/or optical sources on another chip flip-chip bonded to the one or more photonically-enabled chips.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 µm optical wavelength range, and may be integrated on a CMOS silicon-on-insulator (SOI) wafer.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enables modulation of the CW laser signal received from the splitters 103A-103C. The optical modulators 105A-105D may require high-speed electrical signals to modulate the refractive index in respective branches of a Mach-Zehnder interferometer (MZI), for example. In an example embodiment, the control sections 112A-112D may include sink and/or source driver electronics that may enable a bidirectional link utilizing a single laser.

The track and hold amplifiers 150 may comprise a plurality of switches, capacitors, and gain stages. In an example scenario, the track and hold amplifiers 150 comprise push pull differential amplifiers, as described further with respect to FIGS. 2-7, and may be enabled to track an input signal charging a plurality of capacitors, switching the capacitors from the input signal to a differential amplifier for holding the sampled value. While the track and hold amplifiers 150 are described in the photonically-enabled integrated circuit 130, this is merely an example, as other applications are possible where electronic signals are sampled.

The ADCs 155 may comprise circuitry that is operable to receive analog signals from the track and hold amplifiers 150 and generate digital signals for further processing by the processor 160.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to the track and hold amplifiers 150 before being processed further by the processor 160.

Again, while FIG. 1 illustrates an optical transceiver application, the disclosure is not so limited. Accordingly, the track and hold amplifiers with extended dynamic range may be utilized in any application where electrical signals are sampled.

Figures 2A, 2B:
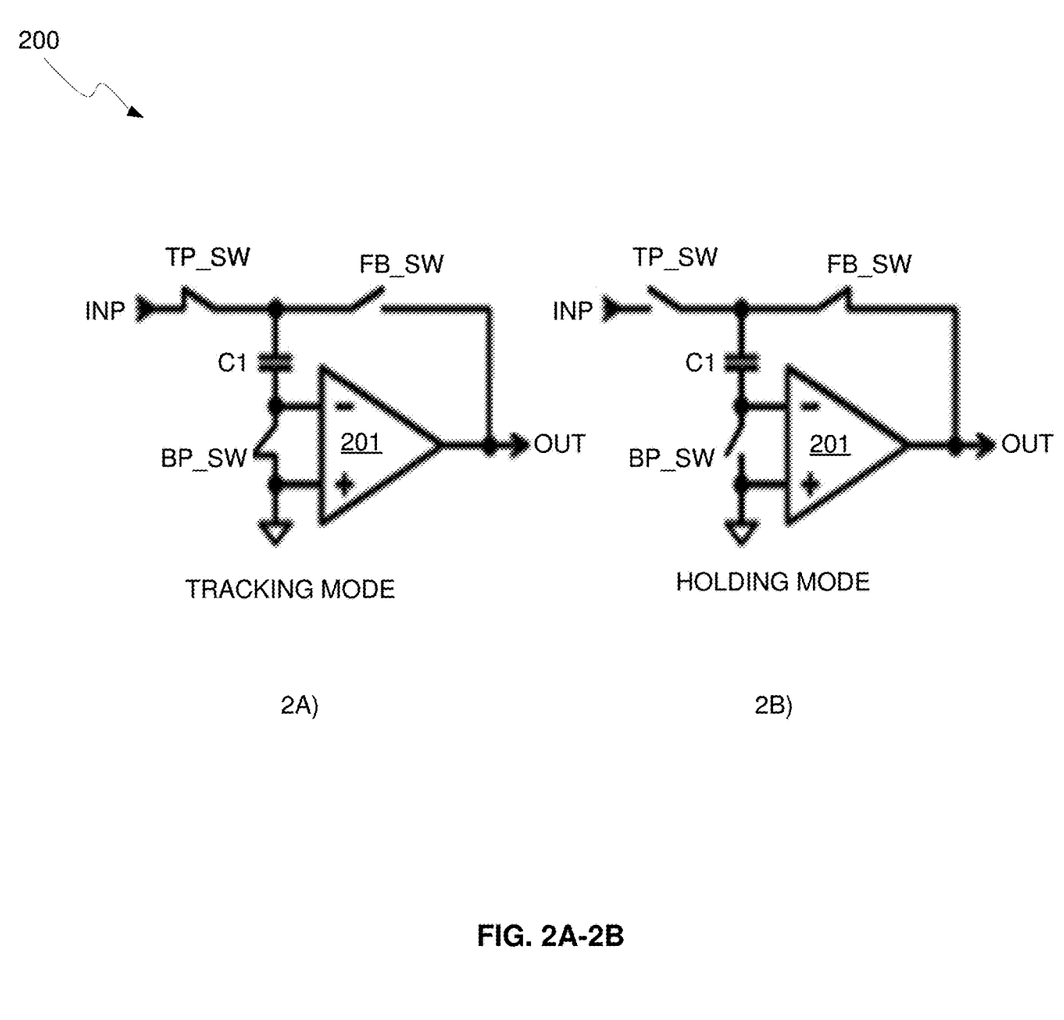
FIGS. 2A-2B illustrate operation of a track and hold amplifier, in accordance with an embodiment of the disclosure.

FIGS. 2A-2B illustrate operation of a typical track and hold amplifier, in accordance with an embodiment of the disclosure. Referring to FIG. 2A, there is shown track and hold amplifier circuit 200 in tracking mode and FIG. 2B shows the track and hold amplifier in holding mode. The bottom plate sampling technique is illustrated by the simplified single-ended model shown in FIGS. 2A-2B.

The model contains a track and hold amplifier 201, sampling capacitor C1, bottom plate switch BP_SW, top plate switch TP_SW, and feedback switch FB_SW. During tracking mode, shown in FIG. 2A, the top and the bottom plate switches TP_SW and BP_SW are closed and the sampling capacitor C1 is tracking the input voltage INP. As the inputs of the amplifier 201 are shorted and the feedback path is open at this point, the input voltage INP is entirely across capacitor C1.

At the moment of sampling, the bottom plate switch BP_SW is opened first then the sampling capacitor C1 is disconnected from the input signal by opening TP_SW and connected to the amplifier output using FB_SW. During the settling of the amplifier output, the input node of the amplifier 201 is returned back to zero voltage, thus cancelling the charge accumulated by the sampling capacitor C1 during the time interval when the bottom switch BP_SW was already opened but the capacitor C1 was still connected to the input node via switch TP_SW. The output voltage OUT is proportional to the charge stored in the capacitor C1 from the input voltage INP.

Figure 3A:
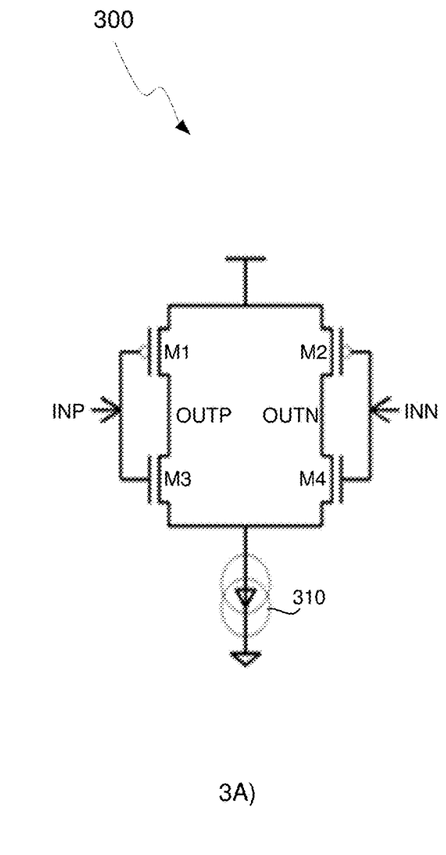
FIGS. 3A and 3B illustrate a push-pull differential amplifier and also a push-pull differential amplifier utilized in a sample and hold circuit, in accordance with an example embodiment of the disclosure.
Figures 3A, 3B:
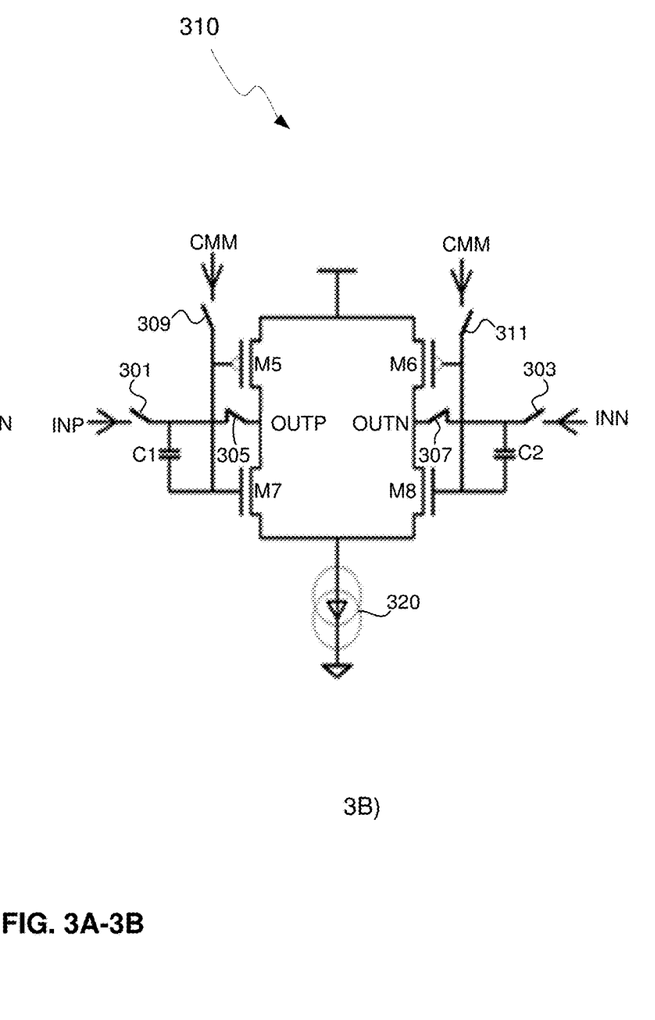

FIGS. 3A and 3B illustrate a push-pull differential amplifier and also a push-pull differential amplifier utilized in a sample and hold circuit, in accordance with an example embodiment of the disclosure. Referring to FIG. 3A, there is shown a push pull differential amplifier 300 and in FIG. 3B a push pull differential amplifier sample and hold circuit 310. The push pull differential amplifier 300 comprises transistors M1-M4 with the gates of M1/M3 and M2/M4 coupled together and M1/M3 and M2/M4 in a stacked configuration, and also comprises current source 310. In this arrangement, the differential output voltage between OUTP and OUTN is proportional to the differential input voltage across the inputs INP and INN.

The push pull differential amplifier sample and hold circuit 310 has similar transistors M5-M8 but also with capacitors C1 and C2, and switches 301-311 for tracking and holding the input differential voltage at terminals INP and INN. The transistors M1-M4 may comprise NMOS and PMOS transistors and the current source 410 may comprise circuitry operable to provide a current for both branches of the differential amplifier 310.

Employing connected back-to-back NMOS and PMOS transistors in a differential amplifier is an attractive topology because it provides a double transconductance for the same amount of tail current through the current source 320. An example of such an amplifier is shown by push pull differential amplifier 300 of FIG. 3A, and usage of such amplifier for a bottom plate sampling track and hold circuit is shown by push pull differential amplifier sample and hold circuit 310 in FIG. 3B. The common mode voltage control is configured by switches 309 and 311 at the CMM inputs. The switches 301-307 enable coupling of the input signals INP and INN to the differential amplifier for sampling/tracking, and then disconnecting for holding.

One issue with this type of amplifier is the dynamic range limitation due to the variation of the transistor parameters, primarily resulting from threshold voltage process and temperature variation. To address this issue, an elevated power supply may be used, but this diminishes the power efficiency of otherwise very attractive topology. This issue is resolved in the improved topology depicted in FIGS. 4A-4B.

Figures 4A, 4B:
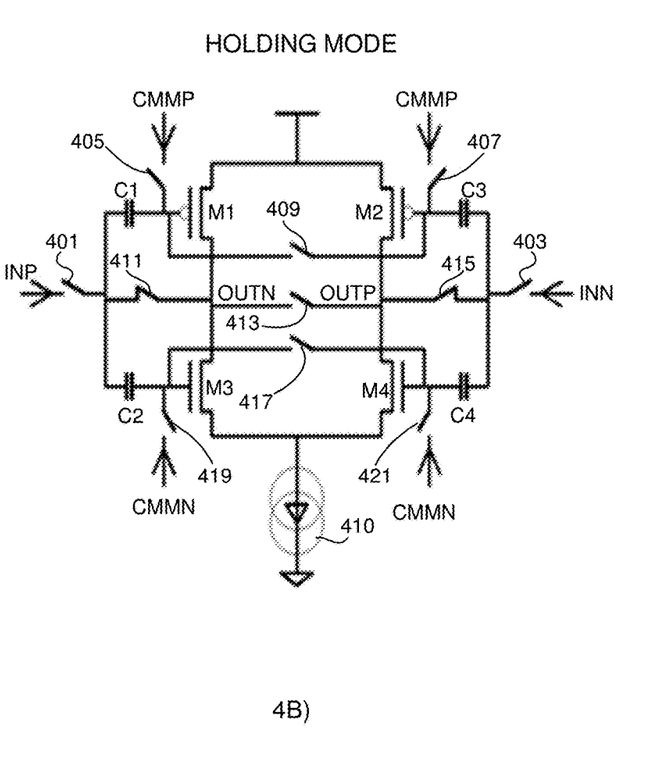
FIGS. 4A-4B illustrate a push-pull differential amplifier utilized in a sample and hold circuit with separate sampling capacitors and individual common mode voltages, in accordance with an example embodiment of the disclosure.

FIGS. 4A-4B illustrate a push-pull differential amplifier utilized in a sample and hold circuit with separate sampling capacitors and individual common mode voltages, in accordance with an example embodiment of the disclosure. Referring to FIG. 4A, there is shown a push-pull differential amplifier sample and hold circuit 400 in tracking mode and FIG. 4B shows the push-pull differential amplifier 400 in holding mode. The push-pull differential amplifier sample and hold circuit 400 comprises transistors M1-M4, switches 401-421, capacitors C1-C4, and current source 410. FIGS. 4A and 4B also show input signals INN and INP, and common mode voltage sources CMMP and CMMN.

Compared to the topology shown in FIGS. 3A and 3B, the sampling capacitors are split in two halves C1/C2 and C3/C4. During the tracking mode shown in FIG. 4A, the bottom plates of the capacitors C1/C2 and C2/C4 are coupled together, with C1 coupled to C3 via switch 409 and C2 coupled to C4 via switch 417. In addition, the gates of the NMOS and PMOS transistors M1-M4, are shunted to each other (M1 to M2 and M3 to M4) by switches 409 and 417 and are also coupled to different sources of the common mode voltage, CMMN and CMMP, by switches 405, 407, 419, and 421. In this mode, switches 401 and 403 are also closed, coupling the input signals INP and INN to the capacitors C1-C4, with the top plates of C1 and C2 coupled to input INP via switch 401 and the top plates of C3 and C4 coupled to input INN via switch 403. Finally, the differential amplifier outputs OUTN and OUTP are coupled together by switch 413 in tracking mode, as shown in FIG. 4A. The switches 401-421 may be configured by clock signals, such as the track and hold clocks shown with respect to FIG. 5, for example. The timing of the clock signals may be controlled by a processor, for example, such as processor 160 shown in FIG. 1.

During the tracking mode, the differential signal INP/INN is coupled across each capacitor pair C1/C3 and C2/C4 and the gates of transistors M1/M2 and M3/M4 are biased by CMMP and CMMN, respectively, while output terminals OUTN and OUTP are shorted together, which charges the capacitor pairs to the differential input voltage and sets the differential output voltage of the push-pull differential amplifier sample and hold circuit 400 to zero.

In the holding mode shown in FIG. 4B, the input signal switches 401 and 403 are opened, as well as the gate shorting switches 409 and 417, the output shorting switch 413, and the common mode voltage source switches 405, 407, 419, and 421. The top plates of the capacitors C1-C4 are coupled to the outputs OUTN and OUTP of the differential amplifier by switches 411 and 415, thereby placing each capacitor pair C1/C2 and C3/C4 in a feedback loop for the differential amplifier.

The common mode voltages CMMP and CMMN separately track the process, voltage, and temperature (PVT) variations of the amplifier PMOS and NMOS transistors M1-M4. Those values of the common mode gate voltages are preserved during the holding mode shown in FIG. 4B, keeping the tail voltage independent of the transistor parameter variation and providing maximal headroom for the amplifier core transistors. Thus, the proposed topology of the track and hold amplifier provides the maximal dynamic range independent on the transistor parameter variation.

Figure 5:
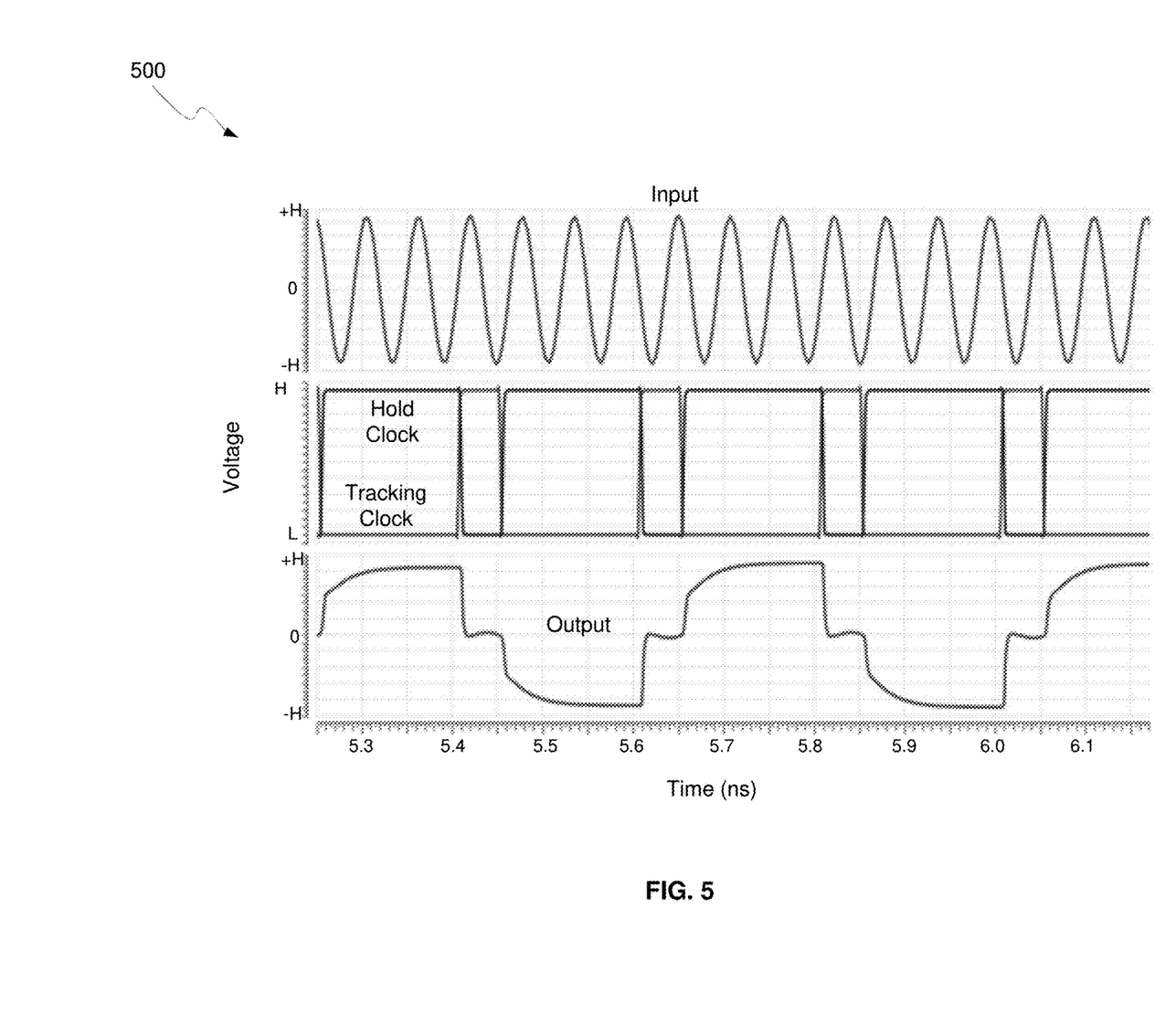
FIG. 5 illustrates input and output waveforms of the push pull track and hold circuit of FIG. 4, in accordance with an example embodiment of the disclosure.

FIG. 5 illustrates input and output waveforms of the push pull track and hold circuit of FIG. 4, in accordance with an example embodiment of the disclosure. Referring to FIG. 5, the top plot shows the differential input signal, while the middle plot shows the clocks enabling the tracking and holding modes, respectively. The bottom plot shows the differential output signal of the track and hold amplifier. During the tracking mode, for example at times 5.4 ns, 5.6 ns, 5.8 ns, and 6.0 ns, the differential output voltage is held around zero voltage, because the output nodes are shorted together, as shown in FIG. 4A. During the holding mode, such as at 5.25 ns, 5.45 ns, 5.65 ns, and 5.85 ns, the output voltage settles at the voltage value sampled by the capacitors, such as capacitors C1-C4 in FIGS. 4A and 4B.

Reference voltage CMMN controls the voltage value at the tail current source, as it biases the gate terminals of M3 and M4 during tracking, as shown in FIG. 4A, but does not significantly affect the value of the tail current. On the other hand, even a small variation of the reference voltage CMMP might cause a significant variation of the drain current of the PMOS transistors M1 and M2 of the amplifier 400 that leads to a variation of the amplifier output common mode voltage.

The values of the reference voltages CMMN and CMMP may be affected by the charge injection of the bottom plate switches 405, 407, 409, 417, 419, and 421, for example, in FIG. 4A. To compensate for this effect, at those nodes, dummy capacitors controlled by a complementary clock may be used, however this solution leads to the increase of the amplifier input capacitance that would reduce the track and hold circuit operating frequency bandwidth. One possible solution for this problem is illustrated in FIGS. 6A and 6B.

Figures 6A, 6B:
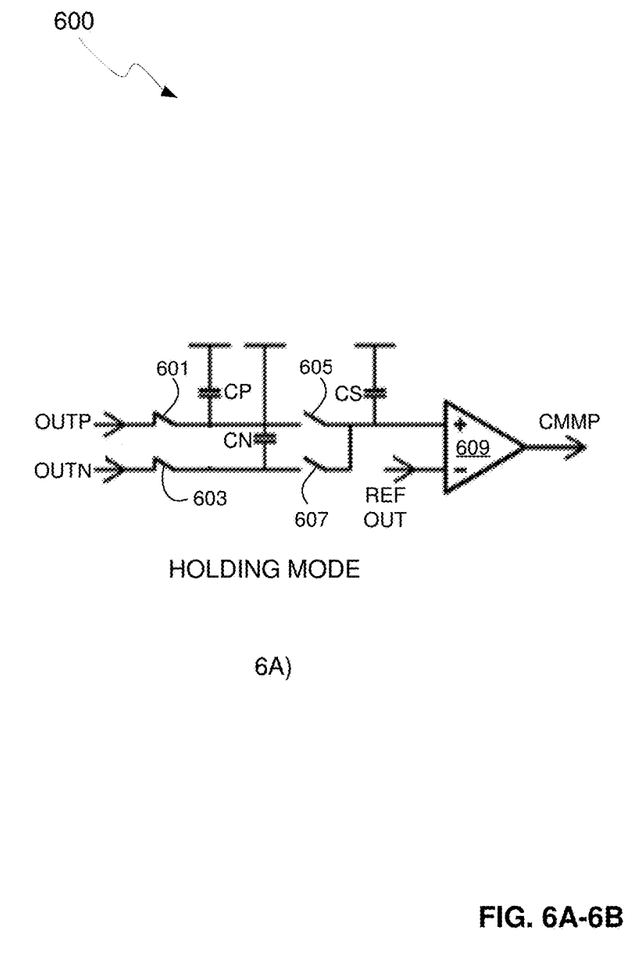
FIGS. 6A and 6B illustrate a switched capacitor feedback loop in holding and tracking mode, in accordance with an example embodiment of the disclosure.
Figure 6B:
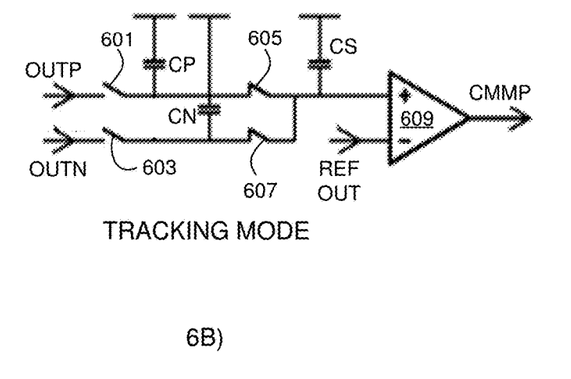

FIGS. 6A and 6B illustrate a switched capacitor feedback loop in holding and tracking mode, in accordance with an example embodiment of the disclosure. Referring to FIGS. 6A and 6B, there is shown switched capacitor circuit 600. The circuit of FIGS. 6A and 6B may be integrated with the circuit of FIGS. 4A and 4B by supplying CMMP in FIGS. 4A and 4B by output CMMP from FIG. 6A, and also coupling OUTN and OUTP of FIGS. 4A and 4B to the terminals OUTN and OUTP of FIGS. 6A and 6B.

The PMOS common mode reference voltage CMMP may be generated by a switched capacitor feedback loop utilizing the switched capacitor circuit 600, which comprises capacitors CP, CN, and CS, switches 601-607, and amplifier 609. One terminal of the amplifier 609 receives an input reference voltage REF OUT, while the other terminal of the amplifier is coupled to capacitor CB and switches 605 and 607. Although the generation of CMMP is shown in FIGS. 6A and 6B, a similar circuit may be utilized to generate CMMN. Alternatively, any reference voltage generator may be used to generate CMMN.

During the holding mode, the top plates of the switched capacitors CP and CN are connected to the output terminals OUTP and OUTN of the track and hold amplifier, such as track and hold amplifier 400, thus sampling the output voltage values, while the bottom plates are connected to the common mode reference voltage, which in this example, is the circuit power supply. During the tracking mode, the top plates of the switched capacitors CP and CN are connected to the output common mode storage capacitor CS via switches 605 and 607. This voltage is amplified by amplifier 609, which generates the PMOS transistor common mode voltage CMMP.

During the operation of the track and hold amplifier, such as track and hold amplifier 400, with the feedback loop 600, the charge transferred by the switching capacitors CP and CN reaches a steady state condition during the holding mode when the common mode output voltage becomes equal to the reference voltage REF OUT. This effect is illustrated by FIG. 7.

Figure 7:
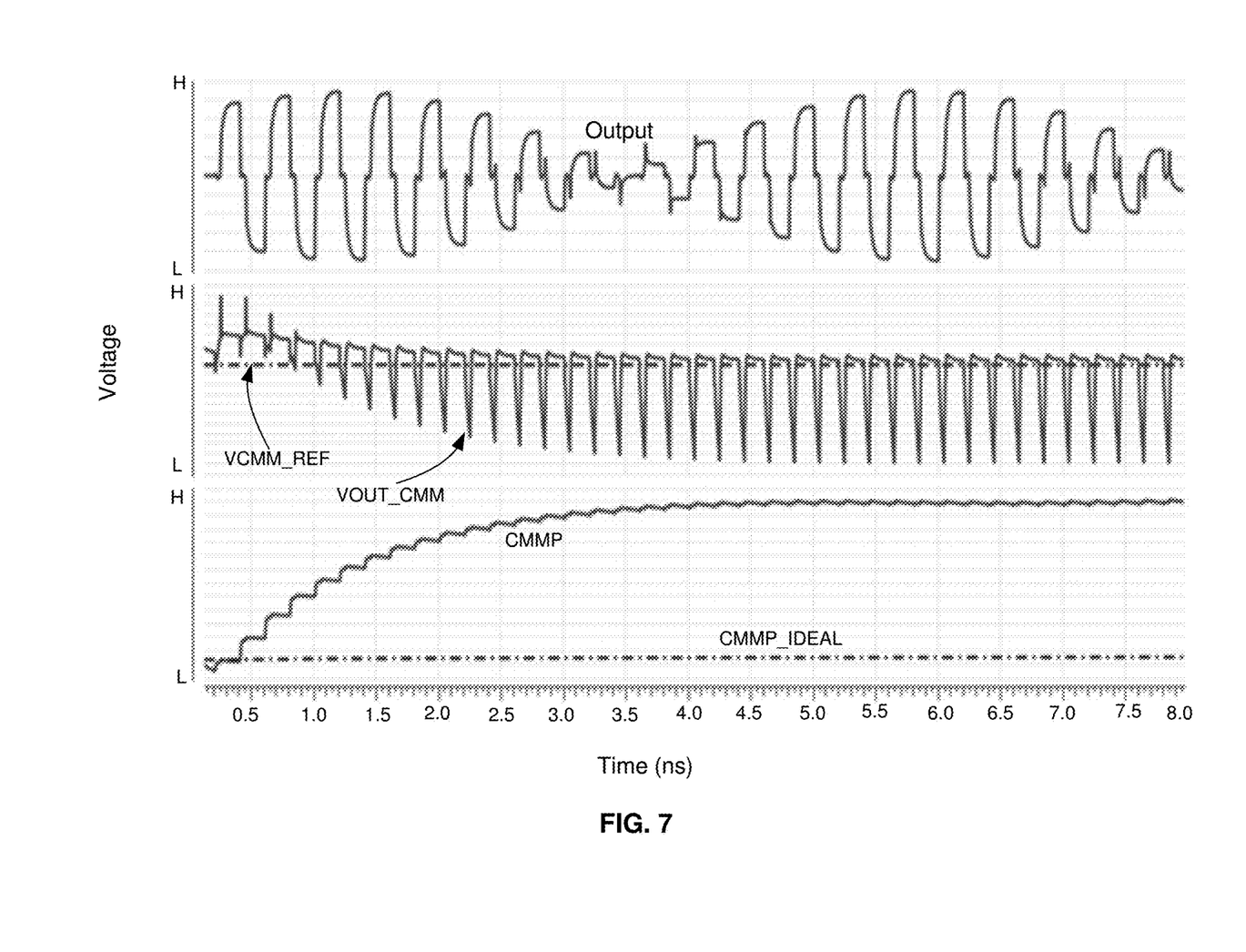
FIG. 7 illustrates output and common mode voltages for a push pull differential amplifier with a switched capacitor feedback loop, in accordance with an example embodiment of the disclosure.

FIG. 7 illustrates output and common mode voltages for a push pull differential amplifier with a switched capacitor feedback loop, in accordance with an example embodiment of the disclosure. The top row of FIG. 7 contains plots of the track and hold amplifier 400 differential output voltage. The middle row depicts the common mode voltage of the amplifier 400 outputs (VOUT_CMM) and the desired common mode voltage (VCMM_REF). The third row depicts the actual value of the reference voltage CMMP and the value that would be used if no charge injection is present (CMMP_IDEAL). In an example scenario, the differential output voltage in the top plot is in the +/−200 mV range, the common mode voltage VOUT_CMM is in the 400 to 800 mV range, and the reference voltage CMMP is in the 500 to 600 mV range.

It is apparent that during the initial phase of operation, the amplifier output common mode voltage VOUT_CMM deviates significantly from the desired value VCMM_REF. However, after the common mode control loop reaches the steady state condition, at the end of each hold mode cycle, the track and hold amplifier output common mode voltage variation is reduced down to just a few millivolts above the expected value, indicating that the switched capacitor feedback loop 600 improves the common mode performance of the track and hold amplifier shown in FIG. 4.

In an example embodiment of the disclosure, a method and system is described for a track and hold amplifier with extended dynamic range. The method and system may comprise a track and hold amplifier comprising a first PMOS transistor coupled to a first NMOS transistor, a second PMOS transistor coupled to a second NMOS transistor, a capacitor at a gate terminal of each NMOS and PMOS transistor, and a plurality of switches. The track and hold amplifier may be operable to, during a tracking mode of the track and hold amplifier, operatively couple a differential input signal to each NMOS and PMOS transistor via a first switch coupled to a first capacitor coupled to the gate terminal of the first PMOS transistor and a second capacitor coupled to the gate terminal of the first NMOS transistor, and via a second switch coupled to a third capacitor coupled to the gate terminal of the second PMOS and a fourth capacitor coupled to the gate terminal of the second NMOS transistor.

The gate terminal of the first PMOS transistor may be operatively coupled to the gate terminal of the second PMOS transistor via a third switch, and the gate terminal of the first NMOS transistor may be operatively coupled to the gate terminal of the second NMOS transistor via a fourth switch. First and second output terminals of the track and hold amplifier may be shorted together via a fifth switch. A first common mode voltage may be coupled to the gate terminals of the first and second PMOS transistors and a second common mode voltage may be operatively coupled to the gate terminals of the first and second NMOS transistors.

During a holding mode, the track and hold amplifier may be operable to open the first, second, third, and fourth switches; decouple the first common mode voltage from the first and second PMOS transistors and the second common mode voltage from the first and second NMOS transistors, operatively couple the first and second capacitors to the first output terminal of the track and hold amplifier via a sixth switch, and operatively couple the third and fourth capacitors to the second output terminal of the track and hold amplifier via a seventh switch. The first and second common mode voltages may be generated using switched capacitor feedback loops.

Each switched capacitor feedback loop may comprise a plurality of capacitors, a plurality of switches, and an amplifier. A fifth capacitor may be operatively coupled to the first output terminal of the track and hold amplifier and a sixth capacitor may be operatively coupled to the second output terminal of the track and hold amplifier. An output voltage of the amplifier in each switched capacitor feedback loop may comprise a common mode voltage for the track and hold amplifier. The first common mode voltage may be operatively coupled to the gate terminals of the first and second PMOS transistors via a first pair of switches. The second common mode voltage may be operatively coupled to the gate terminals of the first and second NMOS transistors via a second pair of switches. The track and hold amplifier may be integrated in one or more complementary metal oxide semiconductor (CMOS) die.

In another example embodiment, a method and system is described for a track and hold amplifier with extended dynamic range. The method and system may comprise a track and hold amplifier comprising a first PMOS transistor coupled to a first NMOS transistor, a second PMOS transistor coupled to a second NMOS transistor, a capacitor at a gate terminal of each NMOS and PMOS transistor, and a plurality of switches. The track and hold amplifier may be operable to, during a tracking mode of the track and hold amplifier, operatively couple a differential input signal to each NMOS and PMOS transistor via a first switch coupled to a first capacitor coupled to the gate terminal of the first PMOS transistor and a second capacitor coupled to the gate terminal of the first NMOS transistor, and via a second switch coupled to a third capacitor coupled to the gate terminal of the second PMOS and a fourth capacitor coupled to the gate terminal of the second NMOS transistor.

The gate terminal of the first PMOS transistor may be operatively coupled to the gate terminal of the second PMOS transistor via a second switch, and the gate terminal of the first NMOS transistor may be operatively coupled to the gate terminal of the second NMOS transistor via a fourth switch. First and second output terminals of the track and hold amplifier may be shorted together via a fifth switch. A first common mode voltage may be operatively coupled from a first switched feedback loop to the gate terminals of the first and second PMOS transistors and a second common mode voltage may be operatively coupled from a second switched capacitor feedback loop to the gate terminals of the first and second NMOS transistors.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
   in a track and hold amplifier comprising a first PMOS transistor coupled to a first NMOS transistor, a second PMOS transistor coupled to a second NMOS transistor, a capacitor at a gate terminal of each NMOS and PMOS transistor, and a plurality of switches:
      during a tracking mode of the track and hold amplifier:
         operatively coupling a differential input signal to each NMOS and PMOS transistor via a first switch coupled to a first capacitor coupled to the gate terminal of the first PMOS transistor and a second capacitor coupled to the gate terminal of the first NMOS transistor, and via a second switch coupled to a third capacitor coupled to the gate terminal of the second PMOS transistor and a fourth capacitor coupled to the gate terminal of the second NMOS transistor;
         operatively coupling the gate terminal of the first PMOS transistor to the gate terminal of the second PMOS transistor via a third switch;
         operatively coupling the gate terminal of the first NMOS transistor to the gate terminal of the second NMOS transistor via a fourth switch;
         operatively coupling a first common mode voltage to the gate terminals of the first and second PMOS transistors; and
         operatively coupling a second common mode voltage to the gate terminals of the first and second NMOS transistors.

2. The method according to claim 1, comprising shunting first and second output terminals together using a fifth switch during the tracking mode of the track and hold amplifier.

3. The method according to claim 2, comprising during a holding mode of the track and hold amplifier:
   opening the first, second, third, and fourth switches;
   decoupling the first common mode voltage from the first and second PMOS transistors and the second common mode voltage from the first and second NMOS transistors;
   operatively coupling the first and second capacitors to the first output terminal of the track and hold amplifier via a sixth switch; and
   operatively coupling the third and fourth capacitors to the second output terminal of the track and hold amplifier via a seventh switch.

4. The method according to claim 1, comprising generating one or more of the first and second common mode voltages using one or more switched capacitor feedback loops.

5. The method according to claim 4, wherein the one or more switched capacitor feedback loops comprises a plurality of capacitors, a plurality of switches, and a first amplifier.

6. The method according to claim 5, wherein a fifth capacitor is operatively coupled to a first output terminal of the track and hold amplifier and a sixth capacitor is operatively coupled to a second output terminal of the track and hold amplifier.

7. The method according to claim 5, wherein an output voltage of the first amplifier in each of the one or more switched capacitor feedback loops comprises a common mode voltage for the track and hold amplifier.

8. The method according to claim 1, wherein the first common mode voltage is operatively coupled to the gate terminals of the first and second PMOS transistors via a first pair of switches.

9. The method according to claim 8, wherein the second common mode voltage is operatively coupled to the gate terminals of the first and second NMOS transistors via a second pair of switches.

10. The method according to claim 1, wherein the track and hold amplifier is integrated in one or more complementary metal oxide semiconductor (CMOS) die.

11. The method according to claim 10, wherein the one or more CMOS die receives an optical signal that is converted to an electrical signal that is coupled to the track and hold amplifier.

12. A system for communication, the system comprising:
    a track and hold amplifier comprising a first PMOS transistor coupled to a first NMOS transistor, a second PMOS transistor coupled to a second NMOS transistor, a capacitor at a gate terminal of each NMOS and PMOS transistor, and a plurality of switches, the track and hold amplifier being operable to:
       during a tracking mode of the track and hold amplifier:

operatively couple a differential input signal to each NMOS and PMOS transistor via a first switch coupled to a first capacitor coupled to the gate terminal of the first PMOS transistor and a second capacitor coupled to the gate terminal of the first NMOS transistor, and via a second switch coupled to a third capacitor coupled to the gate terminal of the second PMOS transistor and a fourth capacitor coupled to the gate terminal of the second NMOS transistor;

operatively couple the gate terminal of the first PMOS transistor to the gate terminal of the second PMOS transistor via a third switch;

operatively couple the gate terminal of the first NMOS transistor to the gate terminal of the second NMOS transistor via a fourth switch;

operatively couple a first common mode voltage to the gate terminals of the first and second PMOS transistors; and operatively couple a second common mode voltage to the gate terminals of the first and second NMOS transistors.

13. The system according to claim 12, wherein the track and hold amplifier is integrated in one or more complementary metal oxide semiconductor (CMOS) die.

14. The system according to claim 12, wherein the first common mode voltage is operatively coupled to the gate terminals of the first and second PMOS transistors via a first pair of switches.

15. The system according to claim 12, wherein first and second output terminals of the track and hold amplifier are shunted together using a fifth switch during the tracking mode of the track and hold amplifier.

16. The system according to claim 12, wherein during a holding mode, the track and hold amplifier is operable to:
open the first, second, third, and fourth switches;
decouple the first common mode voltage from the first and second PMOS transistors and the second common mode voltage from the first and second NMOS transistors;
operatively couple the first and second capacitors to a first output terminal of the track and hold amplifier via a sixth switch; and
operatively couple the third and fourth capacitors to a second output terminal of the track and hold amplifier via a seventh switch.

17. The system according to claim 12, wherein one or more of the first and second common mode voltages are generated using one or more switched capacitor feedback loops.

18. The system according to claim 17, wherein each of the one or more switched capacitor feedback loops comprises a plurality of capacitors, a plurality of switches, and a first amplifier.

19. The system according to claim 18, wherein an output voltage of the first amplifier in each of the one or more switched capacitor feedback loops comprises a common mode voltage for the track and hold amplifier.

20. The system according to claim 18, wherein a fifth capacitor is operatively coupled to a first output terminal of the track and hold amplifier and a sixth capacitor is operatively coupled to the second output terminal of the track and hold amplifier.

21. The system according to claim 19, wherein the second common mode voltage is operatively coupled to the gate terminals of the first and second NMOS transistors via a second pair of switches.

22. A system for communication, the system comprising:
a track and hold amplifier comprising a first PMOS transistor coupled to a first NMOS transistor, a second PMOS transistor coupled to a second NMOS transistor, a capacitor at a gate terminal of each NMOS and PMOS transistor, and a plurality of switches, the track and hold amplifier being operable to, during a tracking mode of the track and hold amplifier:

operatively couple a differential input signal to each NMOS and PMOS transistor via a first switch coupled to a first capacitor coupled to the gate terminal of the first PMOS transistor and a second capacitor coupled to the gate terminal of the first NMOS transistor, and via a second switch coupled to a third capacitor coupled to the gate terminal of the second PMOS transistor and a fourth capacitor coupled to the gate terminal of the second NMOS transistor;

operatively couple the gate terminal of the first PMOS transistor to the gate terminal of the second PMOS transistor via a third switch;

operatively couple the gate terminal of the first NMOS transistor to the gate terminal of the second NMOS transistor via a fourth switch; and short first and second output terminals of the track and hold amplifier together via a fifth switch;

operatively couple a first common mode voltage from a first switched feedback loop to the gate terminals of the first and second PMOS transistors; and operatively couple a second common mode voltage from a second switched capacitor feedback loop to the gate terminals of the first and second NMOS transistors.

\* \* \* \* \*

UNITED STATES PATENT AND TRADEMARK OFFICE
CERTIFICATE OF CORRECTION

PATENT NO. : 10,734,090 B2
APPLICATION NO. : 16/458084
DATED : August 4, 2020
INVENTOR(S) : Oleksiy Zabroda Page 1 of 1

It is certified that error appears in the above-identified patent and that said Letters Patent is hereby corrected as shown below:

In the Claims

In Column 12, Line 12, (approx.), in Claim 20, delete "the" and insert -- a --, therefor.

In Column 12, Line 14, (approx.), in Claim 21, delete "claim 19," and insert -- claim 20, --, therefor.

Signed and Sealed this
Twenty-second Day of September, 2020

Andrei Iancu
*Director of the United States Patent and Trademark Office*